(12) United States Patent
Jain

(10) Patent No.: US 6,275,088 B1
(45) Date of Patent: Aug. 14, 2001

(54) METHOD AND APPARATUS FOR DYNAMIC IMPEDANCE CLAMPING OF A DIGITAL SIGNAL DELIVERED OVER A TRANSMISSION LINE

(75) Inventor: Sandeep K. Jain, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/999,008

(22) Filed: Dec. 29, 1997

Related U.S. Application Data

(63) Continuation-in-part of application No. 08/941,618, filed on Sep. 30, 1997, now Pat. No. 5,994,919.

(51) Int. Cl.[7] .................................................... H03K 5/08
(52) U.S. Cl. .............................................. 327/312; 326/30
(58) Field of Search ................................. 326/30, 31, 33; 327/309, 310, 312, 313, 317, 318, 321, 323, 324, 328, 333

(56) References Cited

U.S. PATENT DOCUMENTS

| | | | |
|---|---|---|---|
| 5,329,190 | * | 7/1994 | Igarashi et al. ...................... 307/540 |
| 5,530,377 | * | 6/1996 | Walls ...................................... 326/30 |
| 5,563,539 | * | 10/1996 | Takase ................................. 327/185 |
| 5,638,328 | * | 6/1997 | Cho ................................. 365/189.05 |
| 5,801,550 | * | 9/1998 | Tanaka et al. .......................... 326/87 |
| 5,949,825 | * | 9/1999 | Naffziger ............................. 375/257 |

* cited by examiner

Primary Examiner—Jeffrey Zweizig
(74) Attorney, Agent, or Firm—Calvin Wells

(57) ABSTRACT

A method and apparatus is disclosed for reducing ringing of a digital signal delivered over a transmission line. A clamping circuit implemented in accordance with one embodiment of the invention includes a delay circuit. The delay circuit receives an input signal delivered over a transmission line and delivers a second signal after a preselected delay. A driver circuit receives the second signal and the input signal and provides an enable signal to a transistor for a period of time corresponding to the preselected delay. The transistor is coupled between a supply voltage and the transmission line. An inverter having an input and an output is also included, with the input of the inverter electrically connected to the transmission line. An additional transistor is electrically coupled between the supply voltage and the transmission line. The additional transistor has an enable input that is electrically connected to the output of the inverter to enable the additional transistor when the inverter outputs a predetermined voltage level.

15 Claims, 6 Drawing Sheets

METHOD AND APPARATUS FOR DYNAMIC IMPEDANCE CLAMPING OF A DIGITAL SIGNAL DELIVERED OVER A TRANSMISSION LINE

This application is a continuation-in-part of U.S. Ser. No. 08/941,618 U.S. Pat. No. 5,994,919, entitled "Method and Apparatus for Reducing Ringing of a Digital Signal Delivered Over a Transmission Line", filed Sep. 30, 1997. Reference is made to the commonly assigned patent application Ser. No. 08/998,590 abandoned, entitled "Method and Apparatus for Clamping a Digital Signal Delivered Over a Transmission Line".

BACKGROUND OF THE INVENTION

1. Field of the Invention

The present invention pertains to the field of interfacing electrical components. More particularly, this invention pertains to the field of reducing ringing of a digital signal delivered over a transmission line.

2. Background of the Related Art

In the field of electronics, information is commonly communicated using digital waveforms that are ideally represented in FIG. 1 by a waveform that transitions between low and high values without distortion. In the real world, a variety of factors affect and undesirably distort the waveform from the idealized representation of FIG. 1. For example, digital signals communicated over relatively long transmission lines can be severely impacted by "ringing." Ringing is defined as a damped oscillation occurring in the signal as a result of distributed inductance and capacitance and their affect on signal transitions. Thus, as shown in FIG. 2, transitions in the digital waveform from low-to-high and high-to-low produce a damped oscillation immediately following the transition. In high frequency digital waveforms, the damped oscillation can last for a substantial period of the signal.

These damped oscillations in the waveform are generally undesirable because they reduce the speed of operation of the overall circuit. That is, no assurances can be given as to what the value of the digital signal will be during this damped oscillatory period, owing to the relatively large transitions in the digital waveform. Thus, if the damped oscillations are not removed from the digital waveform, then any circuitry receiving the digital waveform must wait a preselected period of time to ensure that the damped oscillations have died out sufficiently so as not to affect the value of the digital signal observed. This waiting is, of course, undesirable in that it slows the overall operation of the circuit.

Prior art devices have attempted to reduce the damped oscillations by providing a circuit to clamp the transmission line to the desired high and low levels in response to a transition in the input wave form. These circuits, however, have suffered from at least one significant shortcoming. These clamping circuits have a leakage or quiescent current that is continually present. That is, even when ringing is not present, the clamping circuit still consumes power. Leakage current is particularly problematic in electronic circuits intended for operation from a battery supply. As would be expected, leakage current in a device operating from a battery supply will significantly shorten the useable life before the battery needs to be recharged.

Additionally, these prior art circuits tend to be slow to operate, and for high frequency digital signals, slow operation of the clamping circuit may allow the most significant portion of the damped oscillation to occur before the clamping circuitry takes effect. The slow response of the clamping circuit increases the time required to stabilize the input waveform and remove the damped oscillations, slowing the operation of the overall circuit.

The present invention is directed to overcoming, or at least reducing the effects of, one or more of the problems set forth above.

SUMMARY OF THE INVENTION

A method and apparatus for reducing ringing of a digital signal transmitted over a transmission line is disclosed. A clamping circuit implemented in accordance with one embodiment of the invention includes a delay circuit. The delay circuit receives an input signal delivered over a transmission line and delivers a second signal after a preselected delay. A driver circuit receives the second signal and the input signal and provides an enable signal to a transistor for a period of time corresponding to the preselected delay. The transistor is coupled between a supply voltage and the transmission line. An inverter having an input and an output is also included, with the input of the inverter electrically connected to the transmission line. An additional transistor is electrically coupled between the supply voltage and the transmission line. The additional transistor has an enable input that is electrically connected to the output of the inverter to enable the additional transistor when the inverter outputs a predetermined voltage level.

Figure 1:
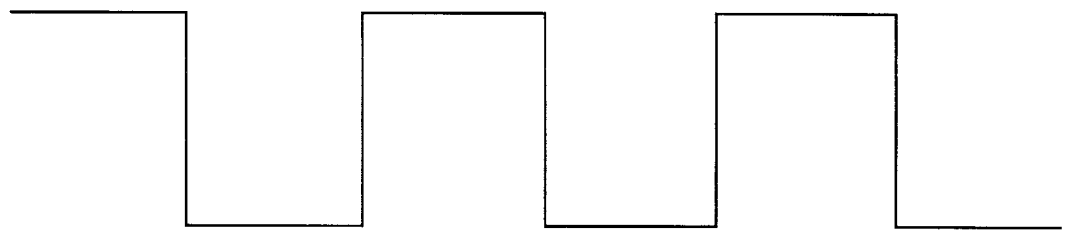
FIG. 1 shows an idealized representation of a digital waveform.
Figure 2:
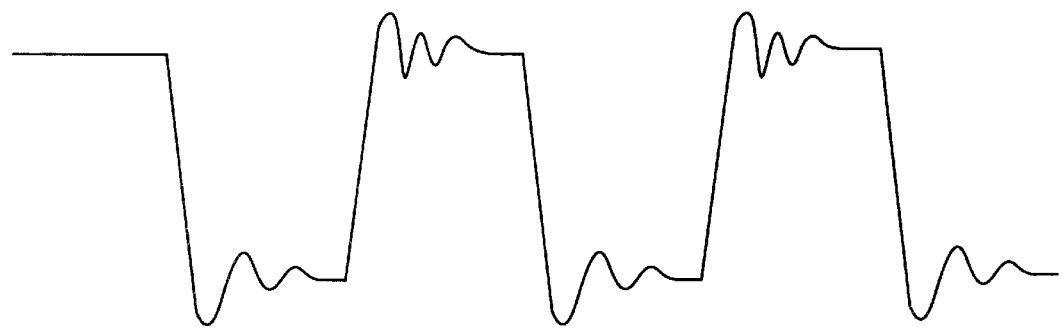
FIG. 2 illustrates an example of a digital waveform affected by ringing.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
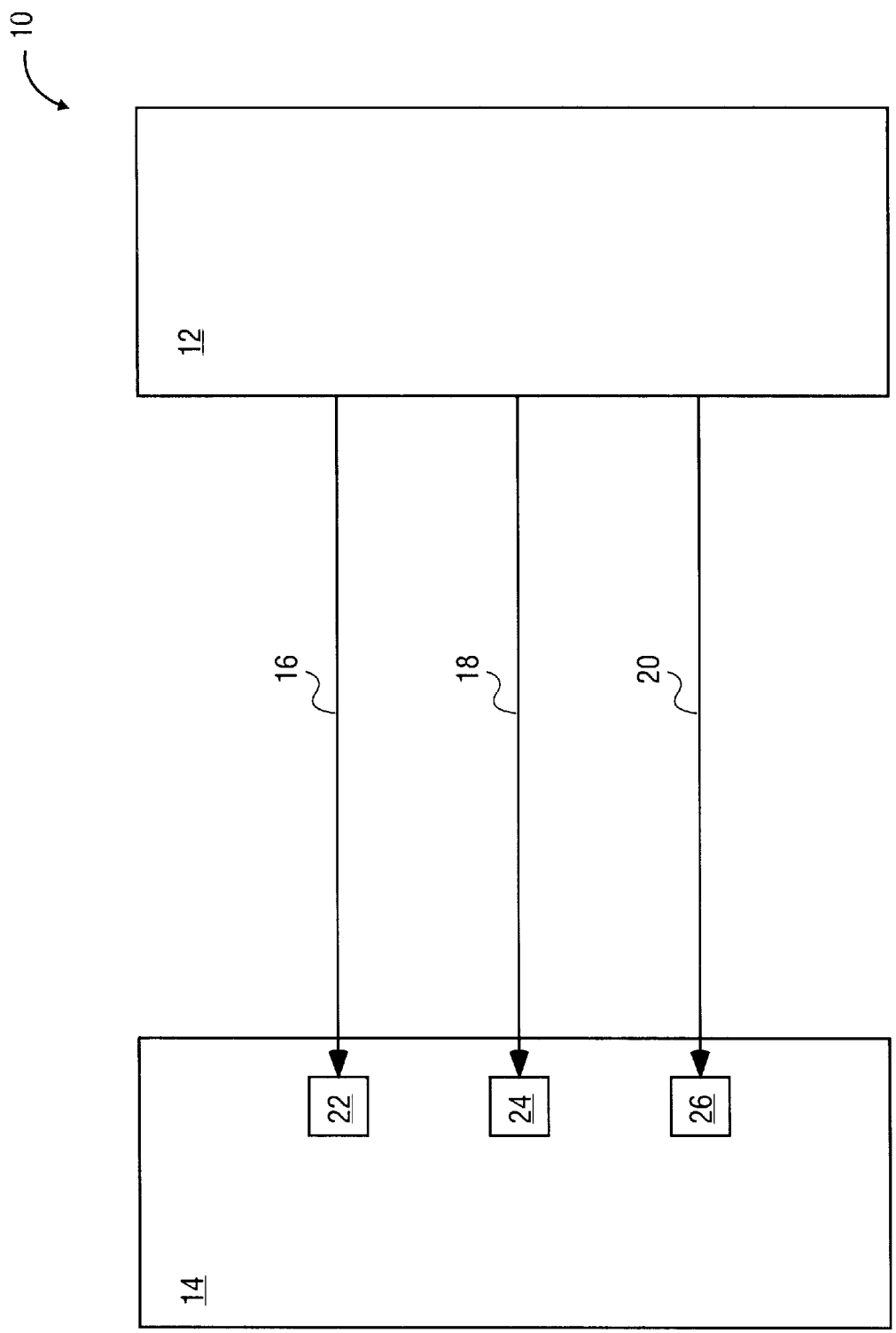
FIG. 3 is a stylized diagram of an example embodiment of an electrical system including a clamping circuit implemented in accordance with the invention.

Turning now to the drawings, and in particular to FIG. 3, a block diagram of an electronic system 10 is shown. The electronic system 10 includes a transmitter 12 and a receiver 14 interconnected by a plurality of transmission lines 16, 18, 20. The transmission lines 16, 18, 20 are connected to clamping circuits 22, 24, 26, respectively, within the receiver 14. The transmission lines 16, 18, 20 can take on a variety of forms, including but not limited to, cables, wires, tracks on a printed circuit board, metal or semiconductor lines within a semiconductor chip, etc. The transmitter 12 and receiver 14 can take on a variety of forms, including but not limited to, a microprocessor, a chip set, memory, peripheral devices, etc.

Figure 4:
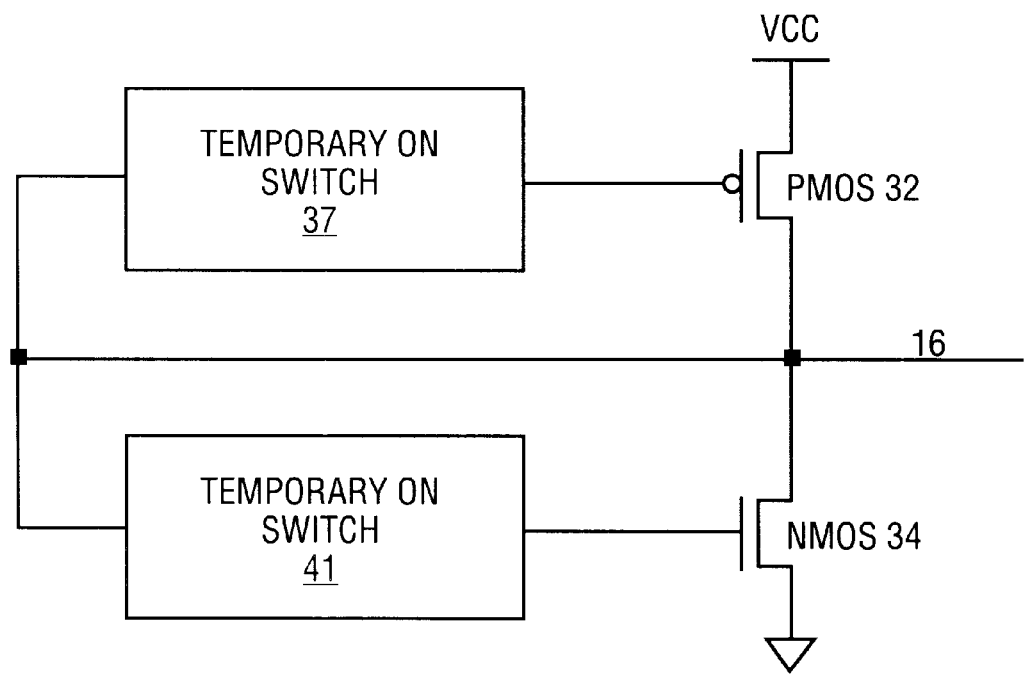
FIG. 4 is a block diagram of one embodiment of a clamping circuit used in an electrical system of the type shown in FIG. 3.

One embodiment of the clamping circuit 22 is illustrated in block diagram form in FIG. 4. The transmission line 16 is connected between a PMOS transistor 32 and an NMOS transistor 34. The transistors 32 and 34 are serially connected between two voltage supplies, a voltage supply Vcc ($V_{supply}$) and ground. The transmission line 16 is also connected to a pair of "temporary on switches", 37 and 41. The term "temporary on switch" as used herein is meant to include any device for biasing an transistor "on" for a predetermined period of time. The temporary on switches 37 and 41 are connected to the enable inputs of the transistors 32, 34.

During normal operation of the clamping circuit 22, a transition in the waveform of a signal on the transmission line 16 is communicated to the temporary on switches 37 and 41. The temporary on switch 37 is configured to enable, or turn "on" the transistor 32 for a predetermined period of time. The transistor 32 should be biased "on" during the time of a low-to-high transition of the digital signal on the transmission line 16. When the transistor 32 is biased "on," the transmission line 16 is pulled toward Vcc to counteract ringing present on the transmission line 16. In a first embodiment, temporary on switch 37 biases the transistor 32 "on" for a preselected period of time after the waveform on the transmission line 16 experiences a low-to-high. One example of the first embodiment is shown in FIG. 5 and is discussed in greater detail below.

The period of time that the transistor 32 is biased "on" depends on a number of factors, including the length of the transmission line 16, the size of the transistor 32, and the value of Vcc. For example, in an embodiment where the length of the transmission line is 10 inches, the size of the transistor is 200×150 microns, and the voltage supply Vcc is 3.3 volts, the preselected period of time for the embodiment illustrated in FIG. 5 is preferably in the range of 2–6 nanoseconds.

The temporary on switch 41 and the transistor 34 operate in a manner similar to that described above with respect to the temporary on switch 37 and the transistor 32, except that the temporary on switch 41 and the transistor 34 are operated in response to a high-to-low transition of the waveform on the transmission line 16. That is, the temporary on switch 41 biases "on" the transistor 34 during a high-to-low transition of the waveform present on the transmission line 16. The temporary on switch 41 thereafter holds the transistor 34 "on" for a preselected period of time. The preselected periods associated with the temporary on switches 37 and 41 need not be identical to each other, and are selected to optimize the performance of the clamping circuit 22 for both high-to-low and low-to-high transitions.

Figure 5:
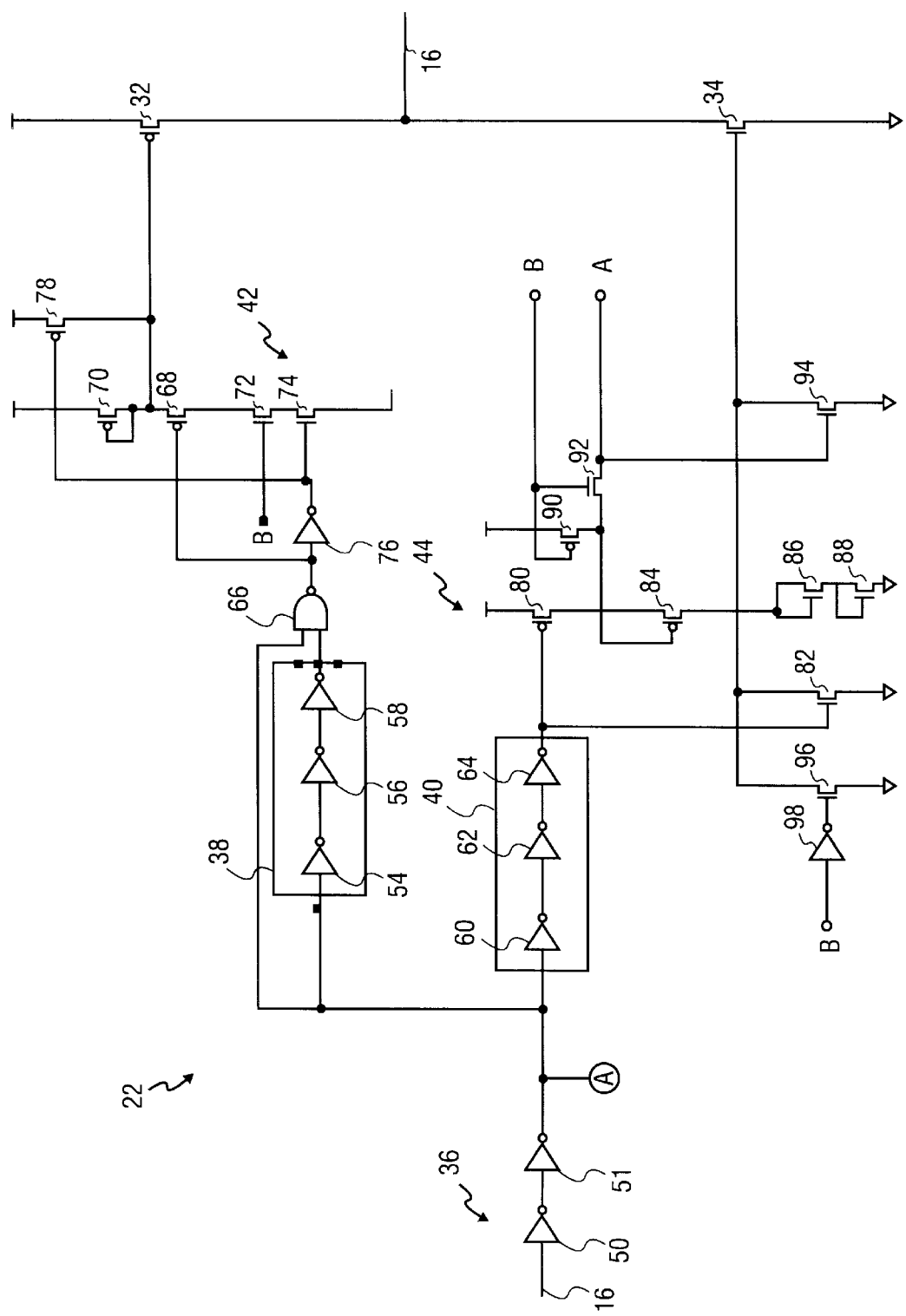
FIG. 5 is a schematic diagram of one embodiment of the clamping circuit of FIG. 4.

Turning now to FIG. 5, a schematic diagram of one embodiment of the clamping circuit 22 is illustrated. The transmission line 16 is connected to an input buffer 36, which is comprised of two inverters 50, 51. The output of the buffer 36 is connected to the delay circuits 38, 40, which are comprised of, in this embodiment, three serially connected inverters 54, 56, 58; 60, 62, 64. The number of inverters employed in the delay circuits 38, 40 is determined by the amount of desired delay, and consequently the time period for which it is desired that the transistors 32, 34 be biased "on."

The output of the buffer 36 is also delivered to a first input of a NAND gate 66. The second input of the NAND gate 66 is connected to the output of the delay circuit 38. The output of the NAND gate 66 is ultimately used to bias the transistor 32 "on" for a period of time corresponding to the delay induced by the three inverters 54, 56, 58. The output of the NAND gate 66 is delivered to a gate input of a PMOS transistor 68 connected in series with transistors 70, 72, 74 between the voltage supply $V_{supply}$ and ground. An inverter 76 has its input terminal connected to the output terminal of the NAND gate 66 and its output terminal connected to the gate of the NMOS transistor 74. The PMOS transistor 70 is connected as a diode, and the junction between the PMOS transistors 70, 68 is connected to the gate of the PMOS transistor 32 and to the voltage supply $V_{supply}$ through a PMOS transistor 78. The PMOS transistor 78 also has its gate connected to the output terminal of the inverter 76.

During normal operation, the PMOS transistor 32 is biased "on" in response to a low-to-high transition of a waveform on the transmission line 16. The input buffer 36 supplies a non-inverted representation of the waveform appearing on the transmission line 16. Thus, during a low-to-high transition on the transmission line 16, the output of the buffer 36 will be seen as a low-to-high transition. Assuming that the output of the buffer 36 has just transitioned to a low state, then the first and second inputs to the NAND gate 66 will both be low, as the output of the delay circuit 38 will not respond to a low state at its input until after the time it takes for the three inverters 54, 56, 58 to change states. The low inputs force the output of the NAND gate 66 to a high state, biasing the PMOS transistor 68 "off," and thereby connecting the voltage supply $V_{supply}$ to the gate of the PMOS transistor 32 through the transistor 70. Additionally, the output of the inverter 76 is in a low state, biasing the transistor 78 "on," thereby connecting the gate of the PMOS transistor 32 to the voltage supply $V_{supply}$ through the transistor 78. The two alternate connections of the gate of the transistor 32 to the voltage supply $V_{supply}$ ensures that the transistor 32 is biased "off" hard.

After the delay induced by the delay circuit 38, the first and second inputs to the NAND gate 66 are in a low and high state, respectively, forcing the output of the NAND gate 66 to remain in a high state. As discussed above, the high state at the output of the NAND gate 66 connects the voltage supply $V_{supply}$ to the gate of the PMOS transistor 32, biasing it "off."

Subsequently, the waveform on the transmission line 16 experiences a low-to-high transition, forcing the output of the buffer 36 to a high state. The first and second inputs to the NAND gate 66 are both in a high state (the delay circuit 38 prevents the second input to the NAND gate 66 from immediately transitioning to a low state), forcing the output of the NAND gate 66 to a low state. The low state at the output of the NAND gate 66 biases the transistor 68 "on" and forces the output of the inverter 76 to a high state, which biases the transistor 78 "off" and the transistor 74 "on." The transistor 72, during normal operation, is biased "on" by a high state control signal applied to an external input B connected to its gate. Thus, the transistors 68, 72, 74 are all biased "on," pulling the gate of the PMOS transistor 32 to ground and biasing it "on." Accordingly, the PMOS transistor 32 is turned "on" in response to a low-to-high transition in the waveform on the transmission line 16.

Subsequently, after the delay induced by the delay circuit 38, the first and second inputs to the NAND gate 66 are in a high and low state, respectively, forcing the output of the NAND gate 66 to a high state. Once again, the high state at the output of the NAND gate 66 biases the PMOS transistor 32 "off." Thus, the transistor 32 is biased "on" in response to a low-to-high transition in the waveform on the transmission line 16 and remains "on" for a period of time corresponding to the delay induced by the delay circuit 38. The delay circuit 38 can be altered to provide varying degrees of delay in accordance with the application intended for the latching circuit 22. That is, longer or shorter delays can be induced by altering the circuitry of the delay circuit 38, such as by increasing or reducing the number of inverters.

Turning now to the circuitry shown in the lower half of FIG. 5, the output of the delay circuit 40 is connected to the gate of a PMOS transistor 80 and the gate of an NMOS transistor 82. The NMOS transistor 82 is serially connected between ground and the gate of the NMOS transistor 34, and the PMOS transistor 80 is serially connected between the voltage supply $V_{supply}$ and the gate of the NMOS transistor 34 through a PMOS transistor 84 interposed therebetween. A pair of transistors 86, 88 are also connected between the gate of the NMOS transistor 34 and ground, but are configured as diodes.

The gate of the PMOS transistor 84 is connected to the voltage supply $V_{supply}$ through a PMOS transistor 90, which has its gate connected to the input B. The gate of the PMOS transistor 84 is also connected to an inverted version of the waveform present on the transmission line 16 via the inverter 50 and an NMOS transistor 92. The gate of the NMOS transistor 92 is also connected to the input B. An NMOS transistor 94 is serially connected between the gate of the NMOS transistor 34 and ground, and has its gate connected to the node A. Finally, an NMOS transistor 96 is also coupled between the gate of the NMOS transistor 34 and ground, and has its gate connected through an inverter 98 to the input B.

During normal operation, the control signal applied to the input B is in a high state, which enables the operation of the latching circuit 22. If it is desired to disable the latching circuit 22 a low state control signal is applied to the input B. The low state at the input B biases the PMOS transistor 90 "on," coupling the gate of the PMOS transistor 84 to the voltage supply $V_{supply}$, thereby biasing the PMOS transistor 84 "off." With the PMOS transistor 84 biased "off," the gate of the NMOS transistor 34 cannot be connected to the voltage supply $V_{supply}$, and thus the NMOS transistor 34 cannot be biased "on."

During normal operation, the NMOS transistor 34 is biased "on" in response to a high-to-low transition of the waveform on the transmission line 16. The input buffer 36 supplies a noninverted representation of the waveform appearing on the transmission line 16. The delay circuit 40, however, supplies an inverted representation of the waveform appearing at the output of the buffer 36. Thus, during a high-to-low transition of the waveform on the transmission line 16, the output of the delay circuit 40 appears as a low-to-high transition, but delayed in time. Assuming that the waveform present on the transmission line 16 has just transitioned to a high state, then the output at the node A is in a high state, and the output of the delay circuit 40 is in a high state until the transition time of the delay circuit 40 has expired. The high state at the output of the delay circuit 40 biases the PMOS transistor 80 "off," and the transistor 82 "on," pulling the gate of the NMOS transistor 34 to ground and biasing it "off." Additionally, the high signal at the node A also biases the NMOS transistor 94 "on," providing an additional path from the gate of the NMOS transistor 34 to ground.

After the delay induced by the delay circuit 40, the output for the delay circuit 40 transitions to a low state, biasing the transistor 80 "on," and the transistor 82 "off." The node A, however, remains at a high state, biasing the PMOS transistor 84 "off." Additionally, the high state at the node A continues to bias the NMOS transistor 94 "on," pulling the gate of the NMOS transistor 34 to ground and biasing the NMOS transistor 34 "off."

Subsequently, the waveform on the transmission line 16 transitions to a low state, forcing the node A to a low state, while the output of the delay circuit 40 remains in its low state. Thus, the PMOS transistor 80 remains biased "on" by the output of the delay circuit 40, and the PMOS transistor 84 is likewise biased "on" by the low state at the node A. With the transistors 80, 84 biased "on," the voltage supply $V_{supply}$ is connected to the gate of the NMOS transistor 34, biasing the transistor 34 "on." With the transistor 34 biased "on," the transmission line 16 is pulled toward ground to counteract the ringing present on the transmission line 16.

After the delay induced by the delay circuit 40, the output of the delay circuit 40 transitions to a high state, biasing the PMOS transistor 80 "off" and the NMOS transistor 82 "on." With the transistor 82 biased "on," the gate of the NMOS transistor 34 is again pulled to ground and biased "off." Thus, a high-to-low transition in the waveform on the transmission line 16 induces the NMOS transistor 34 to be biased "on" for a period of time corresponding to the delay of the delay circuit 40.

The circuitry of the embodiment disclosed in FIG. 5 has been implemented using MOS transistors. However, it is envisioned that other types of transistors (such as bipolar junction transistors (BJT)) could be used in an embodiment without departing from the spirit and scope of the instant invention.

The clamping circuit 22 discussed above in connection with FIGS. 4 and 5 may be referred to as a "dynamic" clamping circuit. The clamping characteristics of the dynamic clamping circuit 22 may be improved by adding an additional clamping circuit that serves to reduce "residual" ringing that may occur after the "on" period of the clamping circuit 22. Once the "on" period has completed, it is possible that "residual" ringing may still exist on the transmission line, or ringing could begin after the "on" period due to a charge dump on the transmission line or due to some other event that could cause ringing. The dynamic clamping circuit 22 does not address this issue. For these reasons it may be desirable to add a clamping circuit that can help reduce the residual ringing. The term "residual ringing" as used herein is meant to include any ringing that occurs outside of the "on" period of the dynamic clamping circuit 22.

Figure 6:
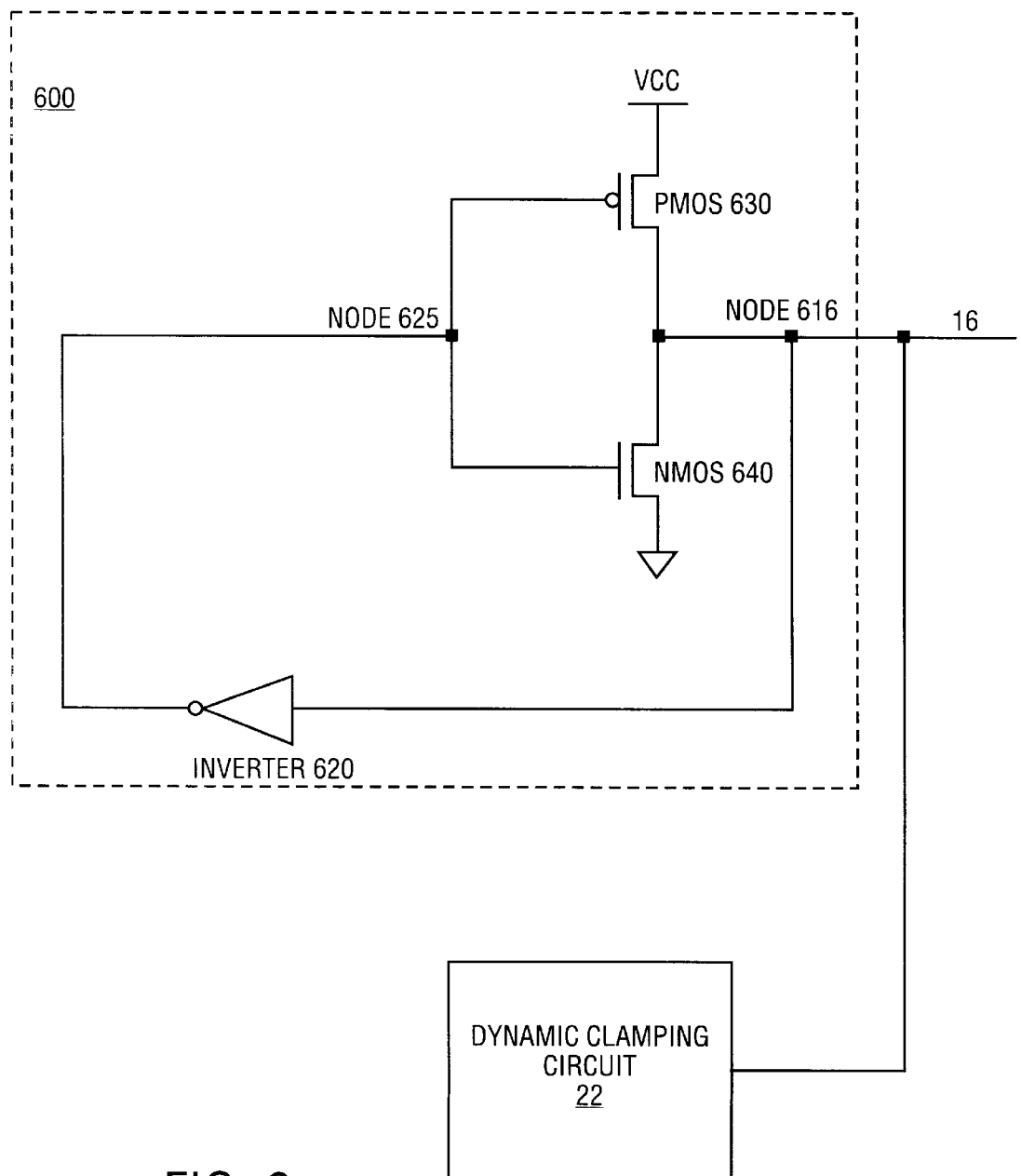
FIG. 6 is a schematic diagram of one embodiment of a clamping circuit including a dynamic clamping circuit and a residual clamping circuit implemented in accordance with the invention.

FIG. 6 illustrates an embodiment of a clamping circuit 600 that works to reduce residual ringing of a digital signal transmitted over the transmission line 16. A digital signal is transmitted over the transmission line 16. The transmission line 16 is electrically connected to the input of an inverter 620, and further connected to one terminal of a PMOS transistor 630 and an NMOS transistor 640. The electrical interconnection between the transmission line 16, the input of the inverter 620, the terminal of the PMOS transistor 630, and the terminal of the NMOS transistor 640 is represented by node 616. The output of the inverter 620 is electrically connected to the enable inputs or gates of the PMOS transistor 630 and the NMOS transistor 640. The interconnection between the output of the inverter 620 and the enable inputs of the transistors 630 and 640 is represented by node 625. The PMOS transistor 630 is electrically connected between node 616 and a supply voltage Vcc. The NMOS transistor 640 is electrically connected between node 616 and ground.

When a logically high voltage level is received over the transmission line 16, the logically high voltage level is received at the input of the inverter 620. The inverter 620 outputs a logically low voltage level which is received at the enable inputs of the transistors 630 and 640. The logically low voltage level enables the PMOS transistor 630 which creates an impedance path between node 616 and the supply voltage Vcc. The path to the supply voltage Vcc serves to stabilize node 616 and also the transmission line 16 at the logically high voltage level, thereby reducing ringing. When the voltage level on node 616 is equal to the supply voltage Vcc, no current will flow through the PMOS transistor 630 between node 616 and the supply voltage Vcc. As a result of this feature, and also as a result of the fact that when the voltage level at node 616 is at a logically low level the PMOS transistor 630 is not enabled, current will only flow through the PMOS transistor 630 when ringing is occurring and the voltage level at node 616 is at a logically high level. Thus, the invention provides a low-power solution for reducing ringing.

For this embodiment, the impedance of the PMOS transistor 630 when enabled is approximately 200 Ω. Other impedance values are possible. The chosen impedance value is preferably one that will allow a driver circuit on the transmitting end of the transmission line to drive the transmission line to a logically low voltage level. If the impedance value of the PMOS transistor 630 is made too low, the resulting pull-up effect caused by the low impedance path to Vcc will not allow a driving circuit on the transmitting end of the transmission line to quickly drive the transmission line to a logically low voltage level, if at all. This corresponds to an overdamped condition.

When a logically low voltage level is received over the transmission line 16, the logically low voltage level is received at the input of the inverter 620. The inverter 620 outputs a logically high voltage level which is received at the enable inputs of the transistors 630 and 640. The logically high voltage level enables the NMOS transistor 640 which creates an impedance path between node 616 and ground. The path to ground serves to stabilize node 616 and also the transmission line 16 at the logically low voltage level, thereby reducing ringing. When the voltage level on node 616 is equal to ground, no current will flow through the NMOS transistor 640 between node 616 and ground. As a result of this feature, and also as a result of the fact that when the voltage level at node 616 is at a logically high level the NMOS transistor 640 is not enabled, current will only flow through the NMOS transistor 640 when ringing is occurring and the voltage level at node 616 is at a logically low level.

For this example embodiment, the impedance value of the NMOS transistor 640 is approximately 200 Ω. Other values are possible. The chosen impedance value is preferably one that will allow a driver circuit on the transmitting end of the transmission line to quickly drive the transmission line to a logically high voltage level.

Although the present example embodiment is described as including MOS transistors that when enabled provide impedance paths between the input pad and either the supply voltage and ground, it is possible to practice the invention with other transistor types, or with any other device or technique whereby impedance paths to the supply voltage and ground can be selectively enabled. Further, although the present embodiment is described as providing selectively enabled impedance paths to a supply voltage and ground, it is possible to practice the invention by providing selectively enable impedance paths to any two voltage levels. Preferably, these two voltage levels will correspond to a logically high voltage level and a logically low voltage level. For example, the logically high voltage level may correspond to a voltage of approximately 3.3 V and the logically low voltage level may correspond to a voltage of approximately 0 V. As previously mentioned, other voltages are possible.

The discussion above in connection with FIGS. 4,5, and 6 describes embodiments of clamping circuits that condition a signal as it is received by a receiving device. However, the invention may also be practiced to provide termination of a signal. Consequently, the invention is not restricted to clamping a digital signal at an input of a receiving device.

As shown in FIG. 6, the residual ringing clamping circuit 600 works in concert with the dynamic clamping circuit 22. During the "on" period of the dynamic clamping circuit 22, a low impedance path to either a supply voltage or to ground is provided. The low impedance paths provide either a strong pull-up or a strong pull-down on the transmission line. The impedance value of the low impedance path may be approximately 50 Ω, although other values are possible. The residual ringing clamping circuit 600 provides a higher impedance path to either a supply voltage or ground. The higher impedance paths provide a weaker pull-up or pull-down on the transmission line. The impedance value of the higher impedance path may be approximately 200 Ω, although other values are possible. Thus, during the "on" period of the dynamic clamping circuit 22, there is either a strong pull-up or a strong pull-down on the transmission line provided by the dynamic clamping circuit 22, while during the "off" period of the dynamic clamping circuit 22 there is either a weaker pull-up or pull-down on the transmission line provided by the residual ringing clamping circuit 600. As mentioned previously, for the residual ringing clamping circuit 600, the impedance values of the transistors 630 and 640 when enabled are preferably such that will allow a driver circuit on the transmitting end of the transmission line 16 to quickly drive the transmission line 16 to a different logical voltage level. The combination of the dynamic clamping circuit 22 and the residual ringing clamping circuit 600 produces the benefit of providing a strong pull-up or pull-down in the period immediately following a transition on the transmission line from one logical voltage level to another in order to reduce the most pronounced ringing that may occur during this time, and further produces the benefit of providing a weaker pull-up or pull-down after the period immediately following a transition in order to reduce residual ringing while allowing a driver circuit on the transmitting end of the transmission line to drive the transmission line to a different logical voltage level.

Figure 7:
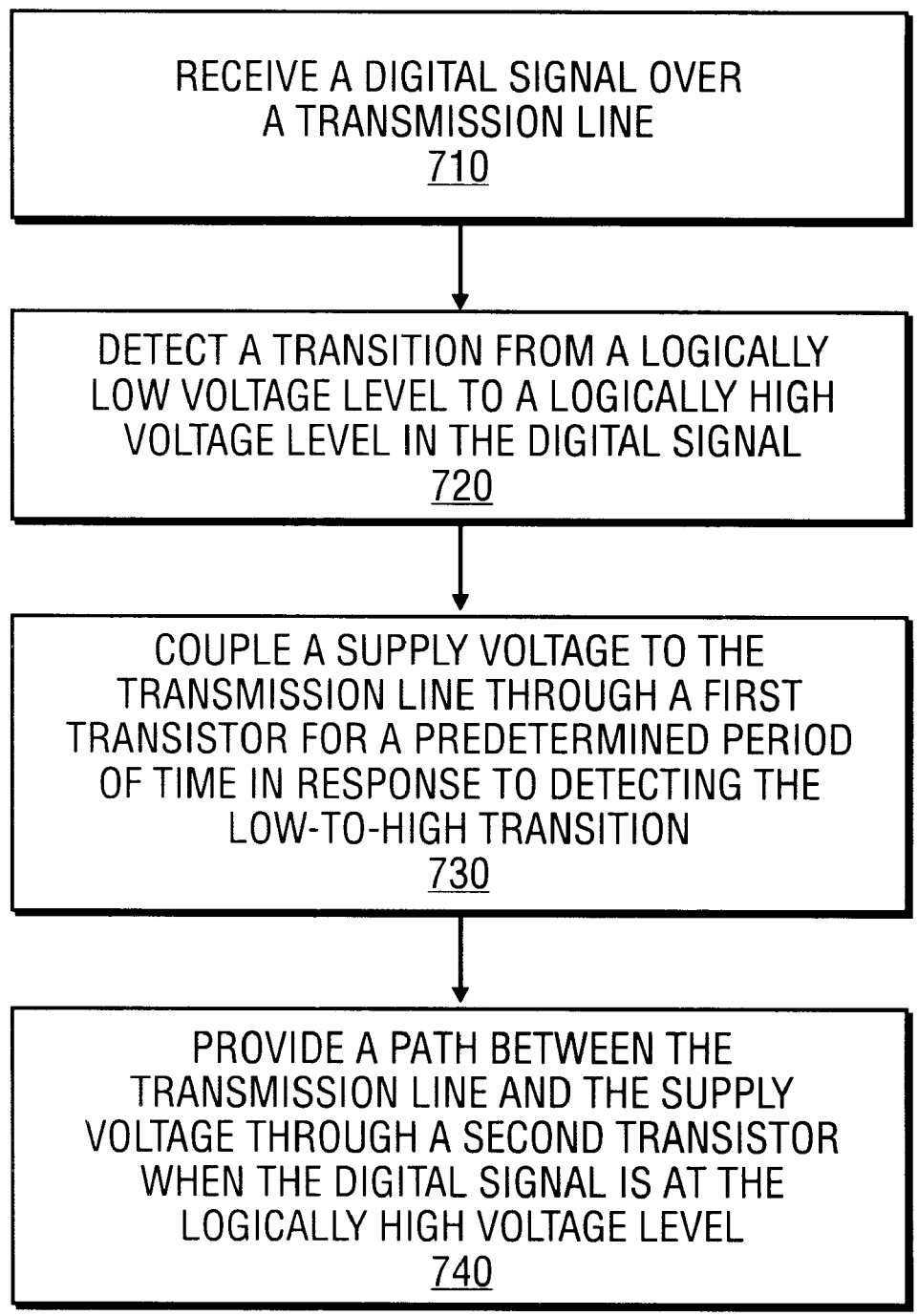
FIG. 7 is a flow diagram of one embodiment of a method for reducing ringing of a digital signal transmitted over a transmission line.

FIG. 7 is a flow diagram of one embodiment of a method for reducing ringing of a digital signal transmitted over a transmission line. A digital signal is received over a transmission line at step 710. At step 720, a transition is detected from a logically low voltage level to a logically high voltage level. In response to the detection of the transition at step 720, a supply voltage is coupled to the transmission line through a first transistor for a predetermined period of time at step 730. Then, at step 740, a path is provided between the transmission line and the supply voltage through a second transistor when the digital signal is at the logically high voltage level.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded in an illustrative rather than in a restrictive sense.

What is claimed is:

1. A clamping circuit, comprising:
   a first delay circuit to receive an input signal delivered over a transmission line and to deliver a second signal after a first preselected delay;
   a first transistor having a first enable input and coupled between a first supply voltage and the transmission line;
   a first driver circuit to receive the input signal and the second signal and to provide a first enable signal to the first enable input for a period of time corresponding to the preselected delay;
   an inverter having an input and an output, the input of the inverter electrically connected to the transmission line; and
   a second transistor electrically coupled between the first supply voltage and the transmission line, the second transistor having a second enable input that is electrically connected to the output of the inverter to enable the second transistor when the inverter outputs a predetermined first voltage level.

2. The clamping circuit of claim 1, further comprising:
   a third transistor electrically coupled between a second supply voltage and the transmission line, the third transistor having a third enable input that is electrically connected to the output of the inverter to enable the third transistor when the inverter outputs a predetermined second voltage level.

3. The clamping circuit of claim 2, further comprising:
   a second delay circuit to receive the input signal transmitted over the transmission line and to deliver a third signal after a second preselected delay;
   a fourth transistor having a fourth enable input and coupled between the second supply voltage and the transmission line; and
   a second driver circuit to receive the input signal and the third signal and to provide a fourth enable signal to the fourth enable input for a period of time corresponding to the second preselected delay.

4. The clamping circuit of claim 3 wherein the first voltage level is a logically low voltage level.

5. The clamping circuit of claim 3 wherein the second voltage level is a logically high voltage level.

6. The clamping circuit of claim 3 wherein the second supply voltage level is approximately 0 V.

7. The clamping circuit of claim 3 wherein the first supply voltage is approximately 3.3 V.

8. The clamping circuit of claim 3 wherein the second transistor has an impedance of approximately 200 Ω when enabled.

9. The clamping circuit of claim 3 wherein the third transistor has an impedance of approximately 200 Ω when enabled.

10. The clamping circuit of claim 3 wherein the first transistor has an impedance of approximately 50 Ω when enabled.

11. The clamping circuit of claim 3 wherein the fourth transistor has an impedance of approximately 50 Ω when enabled.

12. The clamping circuit of claim 3 wherein the first and second preselected delays are each in the range of about 2–6 nanoseconds.

13. An electrical system, comprising:
   a transmitting device;
   a receiving device;
   a transmission line electrically interconnecting the transmitting device and the receiving device; and
   a clamping circuit located in the receiving device, the clamping device including
      a first delay circuit to receive an input signal delivered over a transmission line and to deliver a second signal after a first preselected delay,
      a first transistor having a first enable input and coupled between a first supply voltage and the transmission line,
      a first driver circuit to receive the input signal and the second signal and to provide a first enable signal to the first enable input for a period of time corresponding to the preselected delay,
      an inverter having an input and an output, the input of the inverter electrically connected to the transmission line, and
      a second transistor electrically coupled between the first supply voltage and the transmission line, the second transistor having a second enable input that is electrically connected to the output of the inverter to enable the second transistor when the inverter outputs a predetermined first voltage level.

14. A method for reducing ringing of a digital signal delivered over a transmission line, the method comprising the steps of:
   receiving the digital signal over the transmission line;
   detecting a transition from a logically low voltage level to a logically high voltage level in the digital signal;
   coupling a first supply voltage to the transmission line through a first transistor for a predetermined period of time in response to detecting the low-to-high transition; and
   providing a path between the transmission line and the first supply voltage through a second transistor when the digital signal is at the logically high voltage level.

15. The method of claim 14, further comprising the steps of:
   detecting a transition from the logically high voltage level to the logically low voltage level in the digital signal;
   coupling a second supply voltage to the transmission line through a third transistor for a predetermined period of time in response to detecting the high-to-low transition; and
   providing a path between the transmission line and the second supply voltage through a fourth transistor when the digital signal is at a logically low voltage level.

* * * * *